United States Patent
Jang et al.

(10) Patent No.: US 11,770,955 B2
(45) Date of Patent: Sep. 26, 2023

(54) ORGANIC LIGHT EMITTING DISPLAY DEVICE

(71) Applicant: LG Display Co., Ltd., Seoul (KR)

(72) Inventors: Jaeseung Jang, Seoul (KR); Jaeil Song, Gyeonggi-do (KR); DongHyuk Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 138 days.

(21) Appl. No.: 17/164,680

(22) Filed: Feb. 1, 2021

(65) Prior Publication Data

US 2021/0159282 A1 May 27, 2021

Related U.S. Application Data

(62) Division of application No. 16/423,951, filed on May 28, 2019, now Pat. No. 10,950,665, which is a
(Continued)

(51) Int. Cl.
*H01L 27/32* (2006.01)
*H10K 59/30* (2023.01)
(Continued)

(52) U.S. Cl.
CPC ............ *H10K 59/30* (2023.02); *H10K 50/13* (2023.02); *H10K 59/32* (2023.02); *H10K 50/11* (2023.02);
(Continued)

(58) Field of Classification Search
CPC ............ H01L 27/3206; H01L 27/3209; H01L 51/504; H01L 51/5092; H01L 51/5278; H01L 2251/5384
(Continued)

(56) References Cited

U.S. PATENT DOCUMENTS

2006/0261731 A1 11/2006 Aziz et al.
2007/0228364 A1 10/2007 Radu et al.
(Continued)

FOREIGN PATENT DOCUMENTS

CN 1866536 A 11/2006
CN 103811531 A 5/2014
(Continued)

OTHER PUBLICATIONS

Office Action dated Oct. 20, 2020, issued in corresponding Korean Patent Application No. 10-2014-0175347.
(Continued)

*Primary Examiner* — Dzung Tran
(74) *Attorney, Agent, or Firm* — Morgan, Lewis & Bockius LLP

(57) ABSTRACT

An organic light emitting display device is disclosed. The organic light emitting display device includes a first light emitting part between an anode and a cathode, the first light emitting part having a first light emitting layer, and a second light emitting part between the first light emitting part and the cathode, the second light emitting part having a second light emitting layer and a third light emitting layer, wherein the second light emitting layer includes a hole-type host and a first electron-type host, and the third light emitting layer includes a first electron-type host and a second electron-type host.

11 Claims, 5 Drawing Sheets

Related U.S. Application Data division of application No. 14/884,952, filed on Oct. 16, 2015, now abandoned.

(51) Int. Cl.
  *H10K 50/13*     (2023.01)
  *H10K 59/32*     (2023.01)
  *H10K 50/11*     (2023.01)
  *H10K 50/19*     (2023.01)
  *H10K 50/17*     (2023.01)
  *H10K 101/00*    (2023.01)
  *H10K 101/30*    (2023.01)
  *H10K 101/40*    (2023.01)

(52) U.S. Cl.
  CPC ........... *H10K 50/171* (2023.02); *H10K 50/19* (2023.02); *H10K 2101/00* (2023.02); *H10K 2101/30* (2023.02); *H10K 2101/40* (2023.02); *H10K 2101/90* (2023.02)

(58) Field of Classification Search
  USPC ........................................................ 257/40
  See application file for complete search history.

(56) References Cited

U.S. PATENT DOCUMENTS

| | | | |
|---|---|---|---|
| 2008/0074047 A1 | 3/2008 | Lee et al. | |
| 2008/0160345 A1 | 7/2008 | Inoue et al. | |
| 2008/0290791 A1* | 11/2008 | Lee | H01L 51/5036 445/24 |
| 2008/0297036 A1 | 12/2008 | Noh et al. | |
| 2009/0009072 A1 | 1/2009 | Wellmann et al. | |
| 2009/0026929 A1 | 1/2009 | Song et al. | |
| 2009/0200927 A1* | 8/2009 | D'Andrade | H01L 51/5036 313/504 |
| 2010/0253209 A1 | 10/2010 | Spindler et al. | |
| 2011/0095276 A1 | 4/2011 | Imai et al. | |
| 2012/0098012 A1 | 4/2012 | Kim et al. | |
| 2012/0187859 A1 | 7/2012 | Wellmann et al. | |
| 2013/0069044 A1* | 3/2013 | Ma | H01L 51/0085 257/E51.026 |
| 2013/0134406 A1 | 5/2013 | Ushikubo et al. | |
| 2014/0124766 A1 | 5/2014 | Song et al. | |
| 2014/0167016 A1 | 6/2014 | Yoo et al. | |
| 2017/0155070 A1* | 6/2017 | Han | H01L 27/3246 |

FOREIGN PATENT DOCUMENTS

| | | | |
|---|---|---|---|
| GB | 2426856 A | 6/2006 | |
| KR | 10-2014-0059713 A | 5/2014 | |
| WO | 2011/097259 A1 | 8/2011 | |

OTHER PUBLICATIONS

First Notification of Office Action dated Feb. 28, 2017 from The State Intellectual Property Office of China in counterpart application No. 201510755951.4.

Communication dated May 27, 2016 from the European Patent Office in counterpart European application No. 15187643.0.

* cited by examiner

ORGANIC LIGHT EMITTING DISPLAY DEVICE

This application is a divisional application of U.S. patent application Ser. No. 16/423,951, filed on May 28, 2019, which is a divisional application of U.S. patent application Ser. No. 14/884,952, filed Oct. 16, 2015, which claims the priority benefit of Korean Patent Application No. 10-2014-0175347 filed on Dec. 8, 2014, all of which are incorporated herein by reference for all purposes as if fully set forth herein.

BACKGROUND

Field of the Invention

The present invention relates to an organic light emitting display device, and more particularly, to an organic light emitting display device which is capable of improving lifetime.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc is actively under way.

Among these types of panel displays, the OLED devices are a type of devices that, when a charge is injected into an organic light emitting layer formed between an anode and a cathode, emit light as electron-hole pairs are produced and dissipated. The OLED devices are advantageous in that they can be formed on a flexible transparent substrate such as plastic, can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

A typical organic light emitting display device is formed of organic materials stacked between an anode and a cathode. When a voltage is applied to the organic light emitting display device, holes are injected from the anode, and electrons are injected from the cathode. The injected charges move to the opposite electrode according to the energy levels of the organic layers, and are combined together in a light emitting layer of organic materials to form excitons. When the excitons fall to the ground state, they decay into thermal energy or emit light. As recent research into high-efficiency organic light emitting display devices continues, phosphorescent devices using two types of host and one type of dopant are becoming a mainstream through improvements to the light emitting layer. Especially, materials for the two types of host are chosen in consideration of the properties of each charge of hole-type and electron type.

However, phosphorescent devices using two types of host and one type of dopant have not achieved improvements in lifetime though phosphorescent devices have done in efficiency. The reason of this is that a light emission area formed between a hole transport layer and a light emitting layer causes an interface degradation and an exciton-polaron interaction leads to a lifetime reduction. The cause of the interface degradation and lifetime reduction is the high electron density in the light emission area. High electron densities move the light emission area toward the hole transport layer and exert electric stress on the dopant, thus accelerating the degradation. As a result, the lifetime of the organic light emitting display device is reduced.

SUMMARY

Accordingly, the present invention is directed to an organic light emitting display device that substantially obviates one or more of the problems due to limitations and disadvantages of the related art.

An object of the present invention is to provide an organic light emitting display device which is capable of improving the lifetime of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an organic light emitting display device comprises a first light emitting part between an anode and a cathode, the first light emitting part having a first light emitting layer, and a second light emitting part between the first light emitting part and the cathode, the second light emitting part having a second light emitting layer and a third light emitting layer, wherein the second light emitting layer includes a hole-type host and a first electron-type host, and the third light emitting layer includes a first electron-type host and a second electron-type host.

The LUMO (lowest unoccupied molecular orbital) level of the first electron-type host is within a range from −2.3 eV to −2.5 eV, and the LUMO (lowest unoccupied molecular orbital) level of the second electron-type host is within a range from −2.6 eV to −2.8 eV.

The difference in LUMO levels between the first electron-type host and the second electron-type host is equal to or less than 0.5 eV.

The HOMO level of the first electron-type host and second electron-type host is within a range from −5.4 eV to −5.8 eV.

The electron mobility of the first electron-type host may be equal to or lower than $1\times10^{-5}$ cm$^2$/Vs, and the electron mobility of the second electron-type host is within a range from $1\times10^{-5}$ cm$^2$/Vs to $1\times10^{-4}$ cm$^2$/Vs.

The second light emitting layer and the third light emitting layer include yellow-green light emitting layers.

The organic light emitting display device further comprises a third light emitting part between the second light emitting part and the cathode, the third light emitting part having a fourth light emitting layer.

An occupied volume ratio of the first electron-type host in the third light emitting layer may be equal to or larger than an occupied volume ratio of the second electron-type host in the third light emitting layer.

An occupied volume ratio of the first electron-type host adjacent to the second light emitting layer may be equal to or larger than an occupied volume ratio of the second electron-type host adjacent to the cathode.

In another aspect, an organic light emitting display device comprises a first light emitting part between an anode and a cathode, the first light emitting part having a first light emitting layer, and a second light emitting part between the first light emitting part and the cathode, the second light emitting part having a second light emitting layer, wherein the second light emitting layer includes two regions so that light emission occurs within the second light emitting layer, one of the two regions having a hole-type host and a first electron-type host to adjust electron injection into the second light emitting layer and improve the lifetime of the second light emitting layer, and the other one of the two regions having a first electron-type host and a second electron-type host the first electron-type host and the second electron-type host having a different electron mobility from each other.

The second light emitting layer includes a yellow-green light emitting layer.

The electron mobility of the first electron-type host is lower than the electron mobility of the second electron-type host so as to improve electron injection into the second light emitting layer.

The electron mobility of the first electron-type host is equal to or lower than $1 \times 10^{-5}$ cm$^2$/Vs, and the electron mobility of the second electron-type host is within a range from $1 \times 10^{-5}$ cm$^2$/Vs to $1 \times 10^{-4}$ cm$^2$/Vs.

The difference in LUMO (lowest unoccupied molecular orbital) levels between the first electron-type host and the second electron-type host is small so as to improve electron injection into the second light emitting layer.

The difference in LUMO (lowest unoccupied molecular orbital) levels between the first electron-type host and the second electron-type host is equal to or less than 0.5 eV.

An organic light emitting display device includes one of two regions of the second light emitting layer having a hole-type host and a first electron-type host and the other one of the two regions having first and second electron-type hosts having a different electron mobility has increased lifetime of the organic light emitting display device, as compared with the second light emitting layer having a hole-type host and an electron-type host.

The organic light emitting display device further comprises a third light emitting part having a third light emitting layer between the second light emitting part and the cathode.

An occupied volume ratio of the first electron-type host in the other region may be equal to or larger than an occupied volume ratio of the second electron-type host in the other region.

An occupied volume ratio of the first electron-type host adjacent to the anode may be equal to or larger than an occupied volume ratio of the second electron-type host adjacent to the cathode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
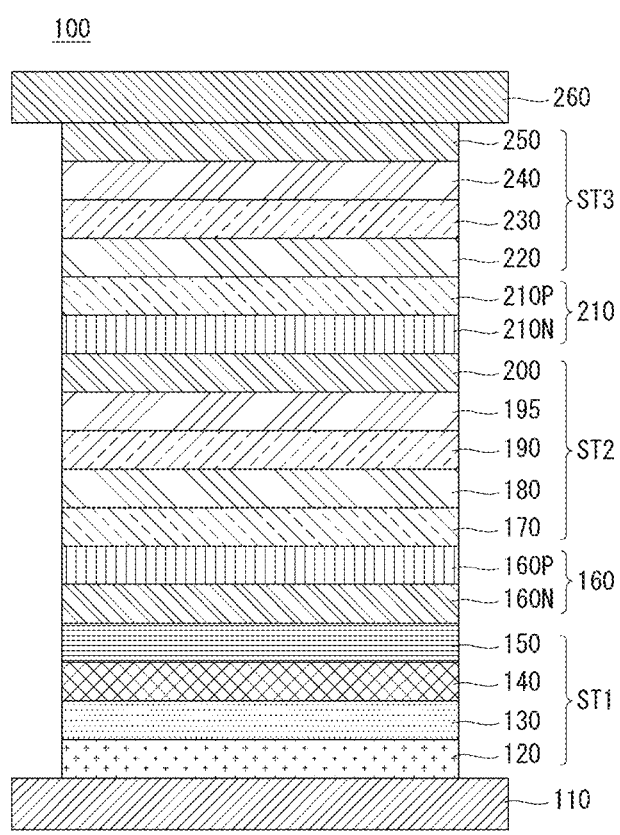
FIG. 1 is a cross-sectional view showing an organic light emitting display device according to a first exemplary embodiment of the present invention.

The advantages and features of the present invention and methods for accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims The shapes, sizes, percentages, angles, numbers, etc shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another either partly or wholly, and may technically interact or work together in various ways. The exemplary embodiments may be carried out independently or in combination with one another.

Hereinafter, various exemplary embodiments of the present invention will be described in detail with reference to the accompanying drawings.

FIG. 1 is a cross-sectional view showing an organic light emitting display device according to a first exemplary embodiment of the present invention.

Referring to FIG. 1, an organic light emitting display device 100 of the present invention comprises light emitting parts ST1, ST2, and ST3 between an anode 110 and a cathode 260, and charge generation layers 160 and 210 between the light emitting parts ST1, ST2, and ST3. Although this exemplary embodiment has been illustrated and described with an example where three light emitting parts are between the anode 110 and the cathode 260, the present invention is not limited to this example and four or more light emitting parts may be between the anode 110 and the cathode 260.

The anode 110 is a hole injection electrode, and may be formed of ITO (indium tin oxide), IZO (indium zinc oxide), or ZnO (zinc oxide) having a high work function. Also, if the anode 110 is a reflective electrode, the anode 110 may further comprise a reflective layer formed of aluminum (Al), silver (Ag), or nickel (Ni) under a layer formed of ITO, IZO, or ZnO.

The first light emitting part ST1 is a single light emitting diode unit, and comprises a first hole injection layer 120, a first hole transport layer 130, a first light emitting layer 140, and a first electron transport layer 150.

The first hole injection layer 120 may function to facilitate hole injection from the anode 110 to the first light emitting layer 140, and may be formed of, but are not limited to, one among CuPc (copper phthalocyanine), PEDOT (poly(3,4)-ethylenedioxythiophene), PANI (polyaniline), and NPD ((N,N'-bis(naphthalene-1-yl)-N,N'-bis(phenyl)-2,2'-dimethylbenzidine). The first hole injection layer 120 may be 1 to 150 nm thickness. If the first hole injection layer 120 is 1 nm thickness or greater, the hole injection properties may be improved, or if the first hole injection layer 120 is 150 nm thickness or less, an increase in the thickness of the first hole injection layer 120 may be prevented and a rise in operating voltage may be therefore prevented. The first hole injection layer 120 may not be included in the composition of the organic light emitting display device, depending on the structure or characteristics of the device.

The first hole transport layer 130 may function to facilitate hole transport, and may be formed of, but are not limited to, one of NPD (N,N'-bis(naphthalene-1-yl)-N,N'-bis(phenyl)-2,2'-dimethylbenzidine), TPD (N,N'-bis-(3-methylphenyl)-N,N'-bis(phenyl)-benzidine), spiro-TAD (2,2'7,7'-tetrakis(N,N-diphenylamino)-9,9'-spirofluorene), and MTDATA (4,4',4"-tris(N-3-methylphenyl-N-phenylamino)-triphenylamine). The first hole transport layer 130 may be 1 to 150 nm thickness. If the first hole transport layer 130 is 1 nm thickness or greater, the hole transport properties may be improved, or if the first hole transport layer 130 is 150 nm thickness or less, an increase in the thickness of the first hole transport layer 130 may be prevented, and a rise in operating voltage may be therefore prevented.

The first light emitting layer 140 may emit light of red, green, or blue. For example, it may be a blue light emitting layer in this exemplary embodiment. The blue light emitting layer comprises one among a blue light emitting layer, a dark blue light emitting layer, or a sky blue light emitting layer. The blue light emitting layer may be formed of, but are not limited to, a phosphorescent material comprising a host material such as CBP (4,4'-bis(carbazol-9-yl)biphenyl) and a dopant material having an iridium-based material. Alternatively, the blue light emitting layer may be formed of, but are not limited to, a fluorescent material comprising any one among spiro-DPVBi, spiro-CBP, distyrylbenzene (DSB), distyrylarylene (DSA), a PFO polymer, and a PPV polymer.

The first electron transport layer 150 functions to facilitate electron transport, and affects the lifetime or efficiency of the organic light emitting display device. The first electron transport layer 150 may be formed of, but are not limited to, one among $Alq_3$ (tris(8-hydroxyquinolinato)aluminum), PBD (2-(4-biphenyl)-5-(4-tert-butylphenyl)-1,3,4-oxadiazole), TAZ (3-(4-biphenyl)-4-phenyl-5-tert-butylphenyl-1,2,4-triazole), and BAlq (bis(2-methyl-8-quinolinolate)-4-(phenylphenolato)aluminum). The first electron transport layer 150 may be 1 to 150 nm thickness. If the first electron transport layer 150 is 1 nm thickness or greater, a degradation of the electron transport properties may be prevented, or if the first electron transport layer 150 is 150 nm thickness or less, an increase in the thickness of the first electron transport layer 150 may be prevented, and a rise in operating voltage may be therefore prevented.

A first charge generation layer (CGL) 160 is over the first light emitting part ST1. The first light emitting part ST1 and the second light emitting part ST2 are connected by the first charge generation layer 160. The first charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the blue light emitting layer 140 adjacent to the anode, and the P-type charge generation layer 160P supplies holes to the light emitting layer of the second light emitting part ST2. As such, the organic light emitting display device with a plurality of light emitting layers can further increase its emission efficiency and lower its operating voltage.

The N-type charge generation layer 160N may be formed of a metal or an N-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be commonly-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 0.5 and 10% relative to 100% for the host. The dopant may have a work function of 2.5 eV or higher. The host material may be an organic material that has a hetero-ring having nitrogen atom, with 20 to 60 carbon atoms, for example, one material among $Alq_3$ (tris(8-hydroxyquinoline)aluminum), triazine, a hydroxyquinoline derivative, a benzazole derivative, and a silole derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be one material among $F_4$-TCNQ (2,3,5,6-tetrafluoro-7,7,8,8,-tetracyanoquinodemethane), a derivative of tetracyanoquinodemethane, iodine, $FeCl_3$, $FeF_3$, and $SbCl_5$. The host may be one material among NPB (N,N'-bis(naphthalene-1-yl)-N,N'-bis (phenyl)-benzidine), TPD (N,N'-bis-(3-methylphenyl)-N, N'-bis(phenyl)-benzidine), and TNB (N,N,N'N'-tetranaphthalenyl-benzidine).

The second light emitting part ST2 comprising a second hole injection layer 170, a second hole transport layer 180, a second light emitting layer 190, a third light emitting layer 195, and a second electron transport layer 200 is over the first charge generation layer 160. The second hole injection layer 170, the second hole transport layer 180, and the second electron transport layer 200 may have the same composition as the first hole injection layer 120, the first hole transport layer 130, and the first electron transport layer 150 of the above-described the first light emitting part ST1, respectively, or have different compositions from their compositions.

The second light emitting layer 190 and the third light emitting layer 195 of the present invention each may emit light of red, green, or blue. In this exemplary embodiment, the second light emitting layer 190 and the third light emitting layer 195 both may be yellow light emitting layers; that is, the second light emitting layer 190 may be a first yellow light emitting layer and the third light emitting layer 195 may be a second yellow light emitting layer. A yellow light emitting layer may be a light emitting layer that emits yellow-green light.

The yellow light emitting layer is a light emitting layer that emits yellow light as a hole injected from the anode 110 and an electron injected from the cathode 260 are bound together and form an excited state. If the yellow light emitting layer's light emission area is formed between a hole transport layer and a light emitting layer, this leads to an interface degradation and a lifetime reduction. Also, high electron densities in the light emission area of the yellow light emitting layer cause the light emission area to be formed between the hole transport layer and the light emitting layer, resulting in an interface degradation and a lifetime reduction. In view of this, the present inventors have formed a yellow light emitting layer comprising a first yellow light emitting layer and a second yellow light emitting layer, in order to form the yellow light emitting layer's light emission area in the middle part of the light emitting layer. Or the present inventors have formed a yellow light emitting layer having two regions so that light emission occurs within the yellow light emitting layer. The two regions includes the first yellow light emitting layer and the second yellow light emitting layer, respectively. The yellow light emitting layer includes a yellow-green light emitting layer. Also, hosts in the first and second yellow light emitting layers may have different compositions, in order to adjust electron injection into the yellow light emitting layer and improve the lifetime of the yellow light emitting layer. Or hosts in the two regions may have different compositions, in order to adjust electron injection into the yellow light emitting layer and improve the lifetime of the yellow light emitting layer. The first yellow light emitting layer comprises a hole-type host and a first electron-type host, and the second yellow light emitting layer comprises a first electron-type host and a second electron-type host. Or, one of the two regions is configured to comprise a hole-type host and a first electron-type host, and the other region is configured to comprise a first electron-type host and a second electron-type host, with the first electron-type host and the second electron-type host having a different electron mobility. The first electron-type host and the hole-type host are adjusted balance of the hole and electron in the first yellow light emitting layer or one of the two regions. The second yellow light emitting layer or the other one of the two regions is configured to have a small difference in LUMO (lowest unoccupied molecular orbital) level between the first electron-type host and the second electron-type host, in order to improve electron injection ability. The LUMO (lowest unoccupied molecular orbital) level of the first electron-type host is within a range of −2.3 eV to −2.5 eV, and the LUMO (lowest unoccupied molecular orbital) level of the second electron-type host is within a range of −2.6 eV to −2.8 eV, and the difference in LUMO (lowest unoccupied molecular orbital) levels between the first electron-type host and the second electron-type host is no more than 0.5 eV. The HOMO (highest occupied molecular orbital) level of the first electron-type host and second electron-type host is within a range of −5.4 eV to −5.8 eV.

Moreover, the electron mobility of the first electron-type host is lower than the electron mobility of the second electron-type host, in order to improve electron injection into the yellow light emitting layer. By using materials with low electron mobility as the first electron-type host and materials with relatively high electron mobility as the second electron-type host, the movement of electrons within the second yellow light emitting layer is adjusted. Hence, the electron mobility of the first electron-type host is equal to or lower than $1\times10^{-5}$ cm$^2$/Vs, and the electron mobility of the second electron-type host is within a range of $1\times10^{-5}$ cm$^2$/Vs to $1\times10^{-4}$ cm$^2$/Vs. Also, since the first electron-type host and second electron-type host of the second yellow light emitting layer are not damaged by electrons, the second yellow light emitting layer can improve stability, thereby preventing or minimizing degradation of the light emitting layer. Therefore, in the present invention, the first yellow light emitting layer comprises a hole-type host and a first electron-type host, and the second yellow light emitting layer comprises a first electron-type host and a second electron-type host.

CBP (4,4'-bis(carbazol-9-yl)biphenyl), NPB (N,N'-bis(naphthalene-1-yl)-N,N'-bis(phenyl)-benzidine), TcTa (4,4', 4"-tris(carbazol-9-yl)triphenylmine, etc may be applied as the hole-type host.

CBP

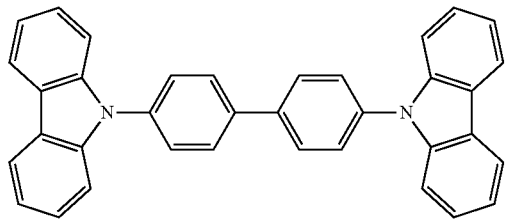

NPB

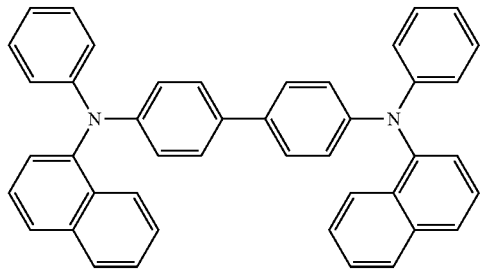

TCTA

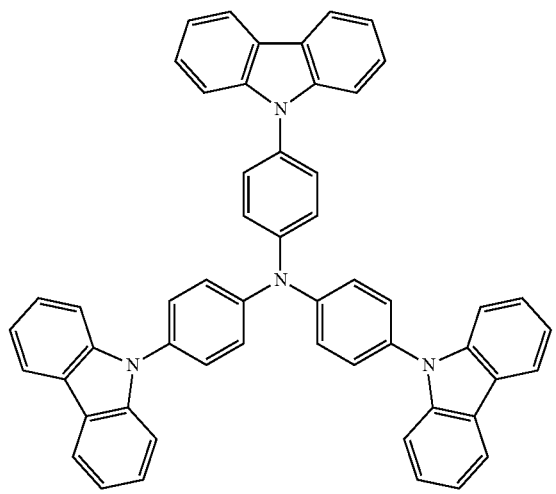

B3PYMPM (4,6-bis(3,5-di(pyridine-3-yl)phenyl)-2-methylpyrimidine), TPBi (2,2′,2″-(1,3,5-benzinetriyl)-tris(1-phenyl-1-H-benzimidazole), 3TPYMB (tris(2,4,6-trimethyl-3-(pyridine-3-yl)phenyl)borane), BmPyPhB (1,3-bis[3,5-di(pyridine-3-yl)phenyl]benzene, etc. may be applied as the first electron-type host and the second electron-type host. The first electron-type host may be formed of one among these materials, and the second electron-type host may be formed of another among the unselected materials. For example, the first electron-type host and the second electron-type host may be formed of one among B3PYMPM and TPBi, respectively, 3TPYMB and BmPyPhB, respectively, or TPBi and 3TPYMB, respectively.

B3PYMPM

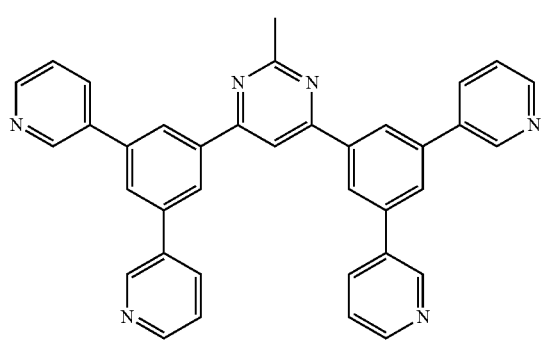

3TPYMB

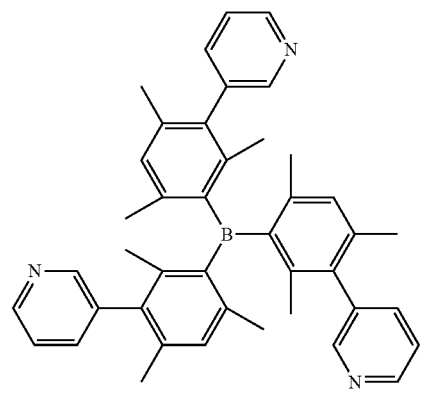

BmPyPB

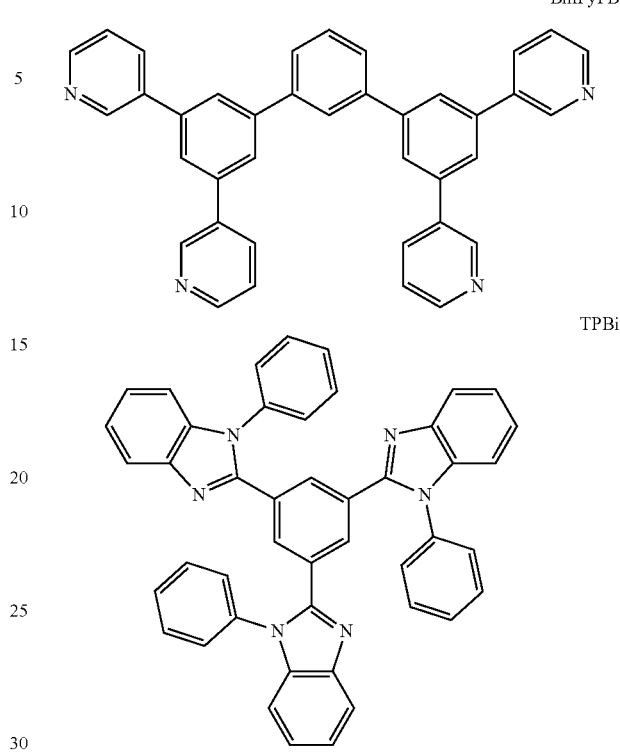

TPBi

Although materials of the hole-type host and electron-type hosts of the present invention have been listed as above, the present invention is not limited thereto and other well-known hole-type materials or electron-type materials may be used so long as host material properties such as HOMO (highest occupied molecular orbital), LUMO (lowest unoccupied molecular orbital), and electron mobility satisfy the aforementioned conditions.

The second charge generation layer 210 is over the second light emitting part ST2. The second charge generation layer 210 is a PN-junction charge generation layer, formed by joining an N-type charge generation layer 210N and a P-type charge generation layer 210P, which generates a charge, or injects the charge, i.e., electrons and holes, separately into the light emitting layers. The N-type charge generation layer 210N has the same composition as the N-type charge generation layer 160N of the first charge generation layer 160, so its description will be omitted. The P-type charge generation layer 210P also has the same composition as the aforementioned P-type charge generation layer 160P of the first charge generation layer 160.

The third light emitting part ST3 comprising a fourth light emitting layer 230 is over the second charge generation layer 210. The fourth light emitting layer 230 may emit light of red, green, or blue. For example, it may be a blue light emitting layer in this exemplary embodiment. The blue light emitting layer comprises a blue light emitting layer, a dark blue light emitting layer, or a sky blue light emitting layer. The third light emitting part ST3 further comprises a third hole transport layer 220 between the second charge generation layer 210 and the fourth light emitting layer 230, and a third electron transport layer 240 and an electron injection layer 250 that are over the fourth light emitting layer 230.

The electron injection layer 250 functions to facilitate electron injection, and may be formed of, but are not limited to, Alq$_3$ (tris(8-hydroxyquinolinato)aluminum), PBD (2-4-biphenyl)-5-(4-tert-butylphenyl)-1,3,4-oxadiazole), TAZ (3-(4-biphenyl)-4-phenyl-5-tert-butylphenyl-1,2,4-triazole), or BAlq (bis(2-methyl-8-quinolinolate)-4-(phenylphenolato) aluminum). On the other hand, the electron injection layer 250 may be formed of a metal compound, and the metal compound may be, for example, but are not limited to, one or more among LiQ, LiF, NaF, KF, RbF, CsF, FrF, BeF$_2$, MgF$_2$, CaF$_2$, SrF$_2$, BaF$_2$, and RaF$_2$. The electron injection layer 250 may be 1 to 50 nm thickness. If the electron injection layer 250 is 1 nm thickness or greater, a degradation of the electron injection properties may be prevented, or if the electron injection layer 250 is 50 nm thickness or less, an increase in the thickness of the electron injection layer 250 may be prevented, and a rise in operating voltage may be therefore prevented. The electron injection layer 250 may be omitted depending on the configuration of the device.

The cathode 260 is over the third light emitting part ST3 to constitute the organic light emitting display device according to the first exemplary embodiment of the present invention. The cathode 260 is an electron injection electrode, and may be formed of one among magnesium (Mg), calcium (Ca), aluminum (Al), silver (Ag), or an alloy thereof, having a low work function. If the organic light emitting display device is a top-emission type or a dual-emission type, the cathode 260 may be formed thin enough to pass light therethrough. If the organic light emitting display device is a bottom-emission type, the cathode 260 may be formed thick enough to reflect light.

As discussed above, the organic light emitting display device according to the first exemplary embodiment of the present invention comprises a first yellow light emitting layer and a second yellow light emitting layer. Or the organic light emitting display device according to the first exemplary embodiment of the present invention comprises a yellow light emitting layer having two regions so that light emission occurs within the yellow light emitting layer. The two regions include the first yellow light emitting layer and the second yellow light emitting layer. The yellow light emitting layer comprises a yellow-green layer. The first yellow light emitting layer or one of the two regions is configured to comprise a first electron-type host and a hole-type host, in order to adjust the hole-electron balance in the first yellow light emitting layer. The second yellow light emitting layer or the other one of the two regions is configured to have a small difference in LUMO (lowest unoccupied molecular orbital) level between the first electron-type host and the second electron-type host, in order to improve electron inject ability from the cathode. The electron mobility of the first electron-type host is lower than the electron mobility of the second electron-type host, in order to improve electron injection into the yellow light emitting layer. By forming the second yellow light emitting layer with low electron mobility as the first electron-type host and materials with relatively high electron mobility as the second electron-type host, the movement of electrons within the second yellow light emitting layer is adjusted. Also, since the first electron-type host and second electron-type host of the second yellow light emitting layer are not damaged by electrons, the second yellow light emitting layer can improve stability, thereby preventing or minimizing degradation of the light emitting layer. As such, the lifetime of the device can be improved.

Figure 2:
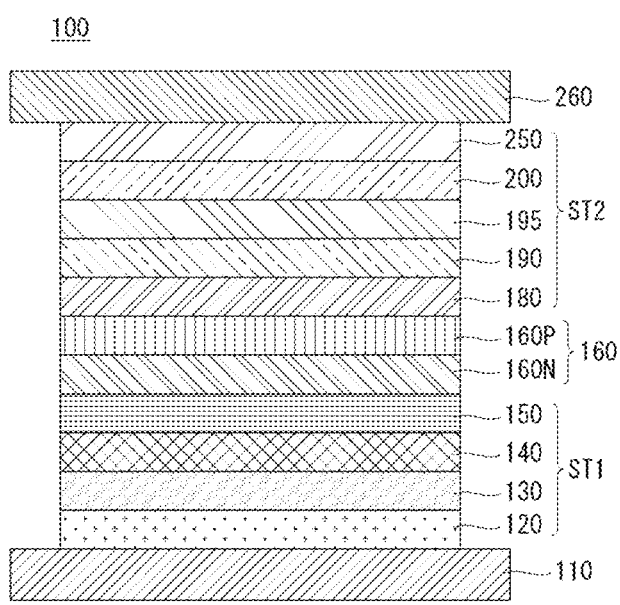
FIG. 2 is a cross-sectional view showing an organic light emitting display device according to a second exemplary embodiment of the present invention.

FIG. 2 is a view showing an organic light emitting display device according to a second exemplary embodiment of the present invention. The same elements as the first exemplary embodiment are denoted by the same reference numerals, so descriptions of these elements will be omitted below.

Referring to FIG. 2, an organic light emitting display device 100 of the present invention comprises a plurality of light emitting parts ST1 and ST2 between an anode 110 and a cathode 260, and a charge generation layer 160 between the light emitting parts ST1 and ST2.

More specifically, the first light emitting part ST1 is a single light emitting diode unit, and comprises a first light emitting layer 140. The first light emitting layer 140 may emit light of red, green, or blue: for example, it may be a blue light emitting layer in this exemplary embodiment. The first light emitting part ST1 further comprises a hole injection layer 120 and a first hole transport layer 130 that are between the anode 110 and the first light emitting layer 140. Also, the first light emitting part ST1 further comprises a first electron transport layer 150 over the first light emitting layer 140. Accordingly, the first light emitting part ST1 comprising the hole injection layer 120, the first hole transport layer 130, the first light emitting layer 140, and the first electron transport layer 150 is formed over the anode 110. The hole injection layer 120 and the first hole transport layer 130 may not be included in the composition of the first light emitting part ST1, depending on the structure or characteristics of the device.

The charge generation layer 160 is over the first light emitting part ST1. The charge generation layer 160 is a PN-junction charge generation layer, formed by joining an N-type charge generation layer 160N and a P-type charge generation layer 160P, which generates a charge, or injects the charge, i.e., electrons and holes, separately into the light emitting layers.

The second light emitting part ST2 comprising a second light emitting layer 190 and a third light emitting layer 195 is over the charge generation layer 160. The second light emitting layer 190 and the third light emitting layer 195 may emit light of red, green, or blue, and they may be yellow light emitting layers, for example, in this exemplary embodiment. Each yellow light emitting layer may comprise a yellow-green light emitting layer.

In the present invention, the second light emitting layer 190 may be a first yellow light emitting layer, and the third light emitting layer 195 may be a second yellow light emitting layer. The first yellow light emitting layer or one of the two regions is configured to comprise a hole-type host and a first electron-type host, and the second yellow light emitting layer is configured to comprise a first electron-type host and a second electron-type host. The first electron-type host and hole-type host are adjusted the hole-electron balance in the first yellow light emitting layer or one of the two regions. The second yellow light emitting layer or the other one of the two regions is configured to have a small difference in LUMO (lowest unoccupied molecular orbital) levels between the first electron-type host and the second electron-type host, in order to improve electron inject ability. The LUMO (lowest unoccupied molecular orbital) level of the first electron-type host is within a range of −2.3 eV to −2.5 eV, and the LUMO (lowest unoccupied molecular orbital) level of the second electron-type host is within a range of −2.6 eV to −2.8 eV, and the difference in LUMO (lowest unoccupied molecular orbital) levels between the first electron-type host and the second electron-type host is no more than 0.5 eV. The HOMO (highest occupied molecular orbital) level of the first electron-type host and second electron-type host is within a range of −5.4 eV to −5.8 eV.

Moreover, the electron mobility of the first electron-type host is lower than the electron mobility of the second electron-type host, in order to improve electron injection into the yellow light emitting layer. By using materials with low electron mobility as the first electron-type host and materials with relatively high electron mobility as the second electron-type host, the movement of electrons within the second yellow light emitting layer or the other one of the two regions is adjusted. Hence, the electron mobility of the first electron-type host is not less than $1\times10^{-5}$ cm$^2$/Vs, and the electron mobility of the second electron-type host is within a range of $1\times10^{-5}$ cm$^2$/Vs to $1\times10^{-4}$ cm$^2$/Vs. Also, since the first electron-type host and second electron-type host of the second yellow light emitting layer are not damaged by electrons, the second yellow light emitting layer can improve stability, thereby preventing or minimizing degradation of the light emitting layer. Therefore, in the present invention, the first yellow light emitting layer or one of the two regions comprises a hole-type host and a first electron-type host, and the second yellow light emitting layer or the other one of the two regions comprises a first electron-type host and a second electron-type host.

The second light emitting part ST2 further comprises a second hole transport layer 180 between the charge generation layer 160 and the second light emitting layer 190, and a second electron transport layer 200 and an electron injection layer 250 that are over the third light emitting layer 195. The cathode 260 is formed over the second light emitting part ST2 to constitute the organic light emitting display device according to the second exemplary embodiment of the present invention.

As discussed above, the organic light emitting display device according to the second exemplary embodiment of the present invention comprises a first yellow light emitting layer and a second yellow light emitting layer. The first yellow light emitting layer or one of the two regions is configured to comprise a first electron-type host and a hole-type host, in order to adjust the hole-electron balance in the first yellow light emitting layer or one of the two regions. The second yellow light emitting layer or the other one of the two regions is configured to have a small difference in LUMO (lowest unoccupied molecular orbital) levels between the first electron-type host and the second electron-type host, in order to improve electron inject ability from the cathode. By using materials with low electron mobility as the first electron-type host and materials with relatively high electron mobility as the second electron-type host, the movement of electrons within the second yellow light emitting layer or the other one of the two regions is controlled. Also, since the first electron-type host and second electron-type host of the second yellow light emitting layer are not damaged by electrons, the second yellow light emitting layer can improve stability, thereby preventing or minimizing degradation of the light emitting layer. As such, the lifetime of the device can be improved.

Figure 3:
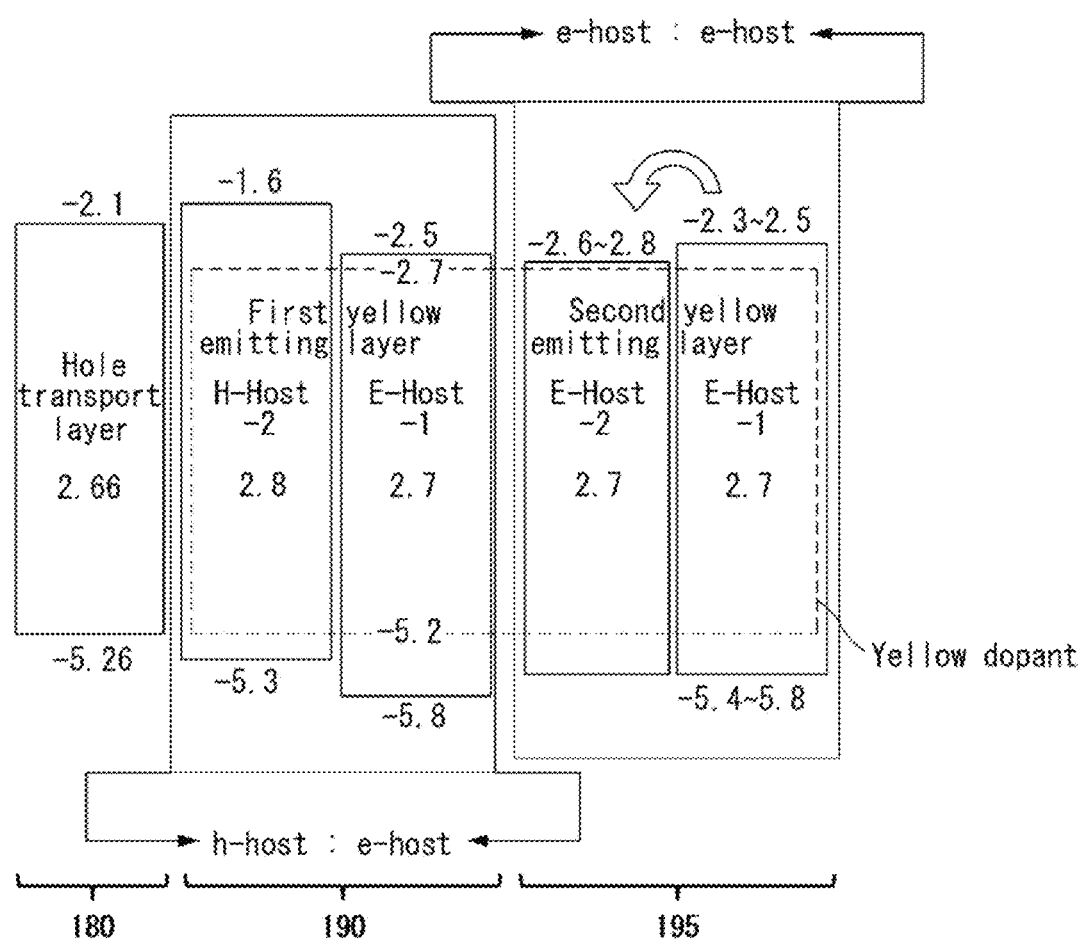
FIG. 3 is an energy band diagram of an organic light emitting display device according to the present invention.

FIG. 3 is an energy band diagram of a second yellow light emitting layer of an organic light emitting display device according to the present invention.

Referring to FIG. 3, a yellow light emitting layer of the present invention comprises a first yellow light emitting layer and a second yellow light emitting layer, and the first yellow light emitting layer comprises a hole-type host H-Host and a first electron-type host E-Host-1, and the second yellow light emitting layer comprises a first electron-type host E-Host-1 and a second electron-type host E-Host-2. The first yellow light emitting layer and the second yellow light emitting layer both comprise the same yellow dopant. Or, the yellow light emitting layer has two regions so that light emission occurs within the yellow light emitting layer. The two regions can be regarded as the first yellow light emitting layer and the second yellow light emitting layer, respectively. The yellow light emitting layer comprises a yellow-green light emitting layer. Also, hosts in the first and second yellow light emitting layers may have different compositions, in order to adjust electron injection into the yellow light emitting layer and improve the lifetime of the yellow light emitting layer. Or, hosts in the two regions may have different compositions, in order to adjust electron injection into the yellow light emitting layer and improve the lifetime of the yellow light emitting layer.

With the use of a hole-type host H-Host and a first electron-type host E-Host-1 as the first yellow light emitting layer, the hole-type host H-Host and the first electron-type host E-Host-1 can improve hole inject ability and electron inject ability, respectively, thereby adjusting the hole-electron balance.

With the use of a first electron-type host E-Host-1 and a second electron-type host E-Host-2 as the second yellow light emitting layer, electron inject ability can be improved because the difference in LUMO (lowest unoccupied molecular orbital) levels between the first electron-type host E-Host-1 and the second electron-type host E-Host-2 is small. By using materials with low electron mobility as the first electron-type host E-Host-1 and materials with relatively high electron mobility as the second electron-type host E-Host-2, the movement of electrons is controlled. Although it is possible to slow down the electron mobility of the hole-type host H-Host, the hole-type host H-Host can be easily degraded compared to the electron-type hosts because it is poor in terms of damage by injected electrons or in terms of stability. Hence, in the present invention, the electron mobility of the electron-type hosts is adjusted. Moreover, electrons moving into the dopant can be trapped in the hosts, and this reduces degradation of the dopant and improves lifetime of the device.

Hereinafter, an embodiment for the manufacture of an organic light emitting display device according to the present invention will be disclosed. However, the following materials for the light emitting layer do not limit the scope of the present invention.

Comparative Example

An organic light emitting display device was manufactured by forming, on a substrate, a hole injection layer, a hole transport layer, a yellow light emitting layer, an electron transport layer, an electron injection layer, and a cathode. The yellow light emitting layer was formed by mixing a CBP host and a B3PYMPM host. The yellow light emitting layer includes the yellow-green light emitting layer.

Embodiment 1

The organic light emitting display device has the same composition as Comparative Example, and includes a first yellow light emitting layer and a second yellow light emitting layer instead of the yellow light emitting layer. The first yellow light emitting layer is formed of a mixture of a CBP host and a B3PYMPM host (the ratio of the CBP host and the B3PYMPM host is 1:1), and the second yellow light emitting layer is formed of a mixture of a B3PYMPM host and a 3TPYMP host (the ratio of the B3PYMPM host and the 3TPYMP host is 3:7). The first and second yellow light emitting layer includes the first and second yellow-green light emitting layer. In the embodiments, the first electron-type host of the first yellow light emitting layer and the first electron-type host of the second yellow light emitting layer include the same material, but are not limited thereto. The first electron-type host of the first and second light emitting layers may be applied the same material or the different material having the range of the LUMO levels and the electron mobility of the embodiments.

Embodiment 2

The organic light emitting display device has the same composition as Embodiment 1. The first yellow light emitting layer is formed of a mixture of a CBP host and a B3PYMPM host (the ratio of the CBP host and the B3PYMPM host is 1:1), and the second yellow light emitting layer is formed of a mixture of a B3PYMPM host and a 3TPYMP host (the ratio of the B3PYMPM host and the 3TPYMP host is 5:5). The first and second yellow light emitting layer includes the first and second yellow-green light emitting layer. In the embodiments, the first electron-type host of the first yellow light emitting layer and the first electron-type host of the second yellow light emitting layer include the same material, but are not limited thereto. The first electron-type host of the first and second light emitting layers may be applied the same material or the different material having the range of the LUMO levels and the electron mobility of the embodiments.

Embodiment 3

The organic light emitting display device has the same composition as Embodiment 1. The first yellow light emitting layer is formed of a mixture of a CBP host and a B3PYMPM host (the ratio of the CBP host and the B3PYMPM host is 1:1), and the second yellow light emitting layer is formed of a mixture of a B3PYMPM host and a 3TPYMP host (the ratio of the B3PYMPM host and the 3TPYMP host is 7:3). The first and second yellow light emitting layer includes the first and second yellow-green light emitting layer. In the embodiments, the first electron-type host of the first yellow light emitting layer and the first electron-type host of the second yellow light emitting layer include the same material, but are not limited thereto. The first electron-type host of the first and second light emitting layers may be applied the same material or the different material having the range of the LUMO levels and the electron mobility of the embodiments.

The materials for the light emitting layer used in the above Comparative Example and Embodiments 1 to 3 do not limit the scope of the present invention.

The operating voltage, efficiency, external quantum efficiency, and lifetime of the devices manufactured according to Comparative Example and Embodiments 1 to 3 were measured and shown in the following Table 1. Also, the current density vs. operating voltage of the devices was measured and shown in FIG. 4, the efficiency vs. luminance was measured and shown in FIG. 5, the external quantum efficiency vs. luminance was measured and shown in FIG. 6, and the rate of decrease in luminance over time was measured and shown in FIG. 7 (the operating voltage, efficiency, external quantum efficiency, and lifetime measurements taken in the embodiments were expressed as a percentage relative to those taken in Comparative Example corresponding to 100%.).

TABLE 1

| | Operating voltage (%) | Efficiency (%) | External quantum efficiency (EQE, %) | Lifetime (%) |
| --- | --- | --- | --- | --- |
| Comparative Example | 100 | 100 | 100 | 100 |
| Embodiment 1 | 102 | 103 | 102 | 121 |
| Embodiment 2 | 105 | 101 | 100 | 133 |
| Embodiment 3 | 107 | 98 | 98 | 145 |

Referring to Table 1 and FIGS. 4 to 7, Embodiments 1 to 3 using a first yellow light emitting layer formed of a mixture of a hole-type host and an electron-type host and a second yellow light emitting layer formed of a mixture of two electron-type hosts showed equivalent levels of operating voltage, efficiency, and external quantum efficiency and a remarkable increase in lifetime of the device, compared to Comparative Example using a single yellow light emitting layer formed of a mixture of a hole-type host and an electron-type host.

Figure 4:
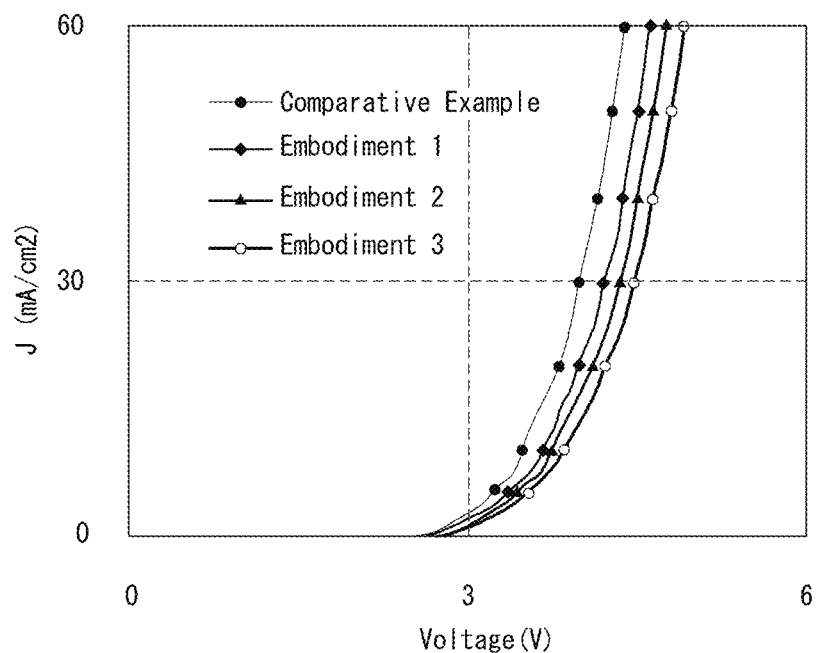
FIG. 4 is a graph of the current density vs. operating voltage of devices according to Comparative Example and Embodiments 1 to 3 of the present invention.

As illustrated in FIG. 4, it can be seen that Embodiments 1 to 3 have similar levels of current density vs. operating voltage.

Figure 5:
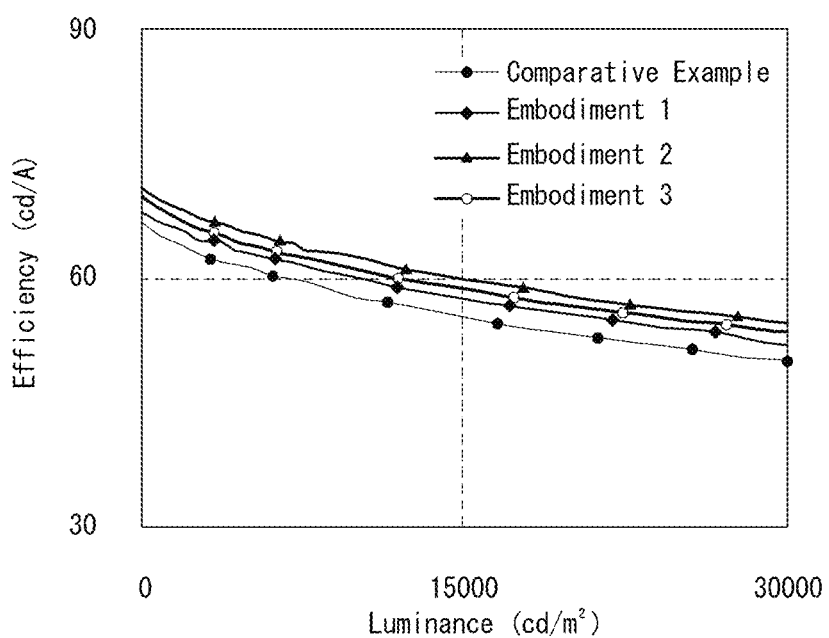
FIG. 5 is a graph of the efficiency vs. luminance of devices according to Comparative Example and Embodiments 1 to 3 of the present invention.
Figure 6:
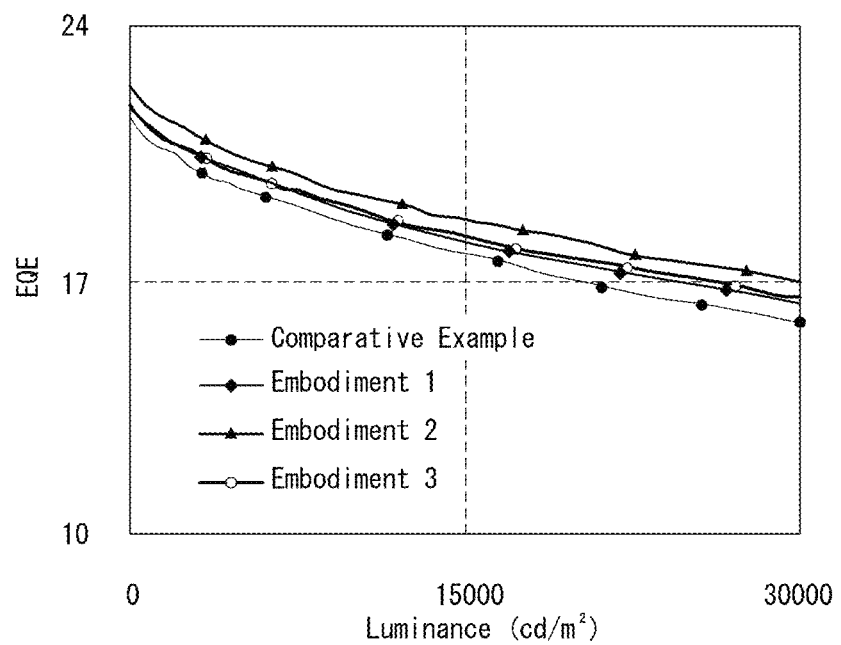
FIG. 6 is a graph of the quantum efficiency vs. luminance of devices according to Comparative Example and Embodiments 1 to 3 of the present invention.
Figure 7:
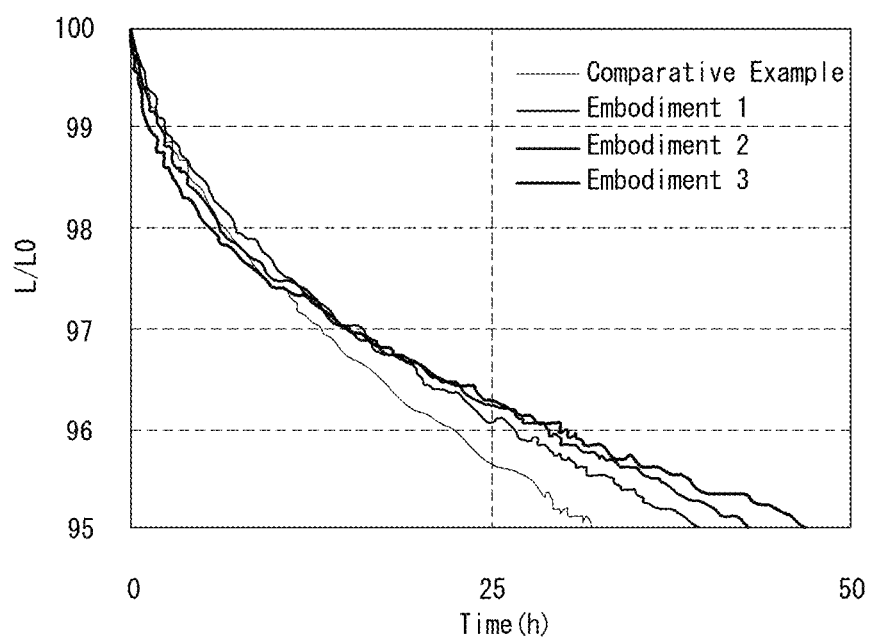
FIG. 7 is a graph of the rate of decrease in luminance over time of devices according to Comparative Example and Embodiments 1 to 3 of the present invention.

As illustrated in FIGS. 5 to 7, Embodiment 1 using the first yellow light emitting layer formed of the mixture of the hole-type host and the first electron-type host (the ratio of the hole-type host and the first electron-type host is 1:1), and the second yellow light emitting layer formed of the mixture of the electron-type host and the first electron-type host (the ratio of the second electron-type host and the electron-type host is 3:7) showed a 2% increase in operating voltage, a 2% increase in external quantum efficiency, a 3% increase in efficiency, and a 21% increase in lifetime, compared to Comparative Example. Also, Embodiment 2 using the first yellow light emitting layer formed of the mixture of the hole-type host and the first electron-type host (the ratio of the hole-type host and the first electron-type host is 1:1) and the second yellow light emitting layer formed of the mixture of the first electron-type host and the second electron-type host (the ratio of the first-electron host and the second-electron host is 5:5) showed a 5% increase in operating voltage, the same level of external quantum efficiency, a 1% increase in efficiency, and a 33% increase in lifetime, compared to Comparative Example. Also, Embodiment 3 using the first yellow light emitting layer formed of the mixture of the hole-type host and the first electron-type host (the ratio of the hole-type host and the first electron-type host is 1:1) and the second yellow light emitting layer formed of the mixture of the first electron-type host and the second electron-type host (the ratio of the first electron-type host and the second electron-type host is 7:3) showed a 7% increase in operating voltage, a 2% decrease in external quantum efficiency, a 2% decrease in efficiency, and a 45% increase in lifetime, compared to Comparative Example.

From these results, it can be found out that the lifetime of a device comprising a single yellow light emitting layer having a mixture of a hole-type host and an electron-type host is shorter than the lifetime of a device having a first yellow light emitting layer having a mixture of a hole-type host and an electron-type host and a second yellow light emitting layer having a mixture of two electron-type hosts. Also, it can be found out that the lifetime of a device is longer when a device having the second yellow light emitting layer includes a mixture of two electron-type hosts (the ratio of the two electron-type host is 7:3) rather than a device having the second yellow light emitting layer formed of a mixture of two electron-type hosts (the ratio of the two electron-type hosts is 3:7). And an organic layer of the organic light emitting display device is formed by thermal evaporation method. Generally, the thermal evaporation method forms an organic material to a thickness of 1 Å in a second. For example, if a volume ratio of the first electron-type host and the second electron-type host is 3:7 on the basis of the thermal evaporation method having a thickness of 1 Å in a second, the first electron-type host is formed a thickness of 0.3 A in a second and the second electron-type host is formed a thickness of 0.7 A in a second. And, it can be found out that the lifetime of a device is longer when a device having the second yellow light emitting layer includes an occupied volume ratio of the electron-type host adjacent to the first yellow light emitting layer is equal to or larger than an occupied volume ratio of the electron-type host adjacent to the electron transport layer or the cathode. Also, an occupied volume ratio of the first electron-type host in the second light emitting layer is equal to or larger than an occupied volume ratio of the second electron-type host in the second light emitting layer, thereby increasing the lifetime of the organic light emitting display device. Occupied volume ratio may refer to the portion or part of volume occupied by a respective material in a certain layer. That is, an occupied volume ratio in the third light emitting layer may be based on a sum of the occupied volumes of first electron-type host and the second electron-type host.

Accordingly, it can be concluded that the organic light emitting display device including one of the two regions of the yellow light emitting layer having a hole-type host and a first electron-type host and the other one of the two regions having first and second electron-type hosts having a different electron mobility has increased lifetime of the organic light emitting display device, as compared with the yellow light emitting layer comprises a hole-type host and an electron-type host. The first and second yellow light emitting layer includes the first and second yellow-green light emitting layer.

As discussed above, an organic light emitting display device according to an exemplary embodiment of the present invention comprises a first yellow light emitting layer and a second yellow light emitting layer. The first yellow light emitting layer or one of the two regions is configured to comprise a first electron-type host and a hole-type host, in order to adjust the hole-electron balance in the first yellow light emitting layer or one of the two regions. The second yellow light emitting layer or the other one of the two regions is configured to have a small difference in LUMO (lowest unoccupied molecular orbital) levels between the first electron-type host and the second electron-type host, in order to improve electron inject ability from the cathode. Moreover, the electron mobility of the first electron-type host is lower than the electron mobility of the second electron-type host, in order to improve electron injection into the yellow light emitting layer. By using materials with low electron mobility as the first electron-type host and materials with relatively high electron mobility as the second electron-type host, the movement of electrons within the second yellow light emitting layer or the other one of the two regions is adjusted. Also, since the first electron-type host and second electron-type host of the second yellow light emitting layer are not damaged by electrons, the second yellow light emitting layer can improve stability, thereby preventing or minimizing degradation of the light emitting layer. As such, the lifetime of the device can be improved. Also, an occupied volume ratio of the first electron-type host in the one region of the yellow light emitting layer is equal to or larger than an occupied volume ratio of the second electron-type host in the another region of the yellow light emitting layer, thereby increasing the lifetime of the organic light emitting display device. And, an occupied volume ratio of the first electron-type host adjacent to the anode is equal to or larger than an occupied volume ratio of the second electron-type host adjacent to the cathode, thereby increasing the lifetime of the organic light emitting display device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
an anode;
a first hole transport layer over the anode;
a first light emitting layer over the first hole transport layer;
a first electron transport layer over the first light emitting layer;
a first charge generation layer over the first electron transport layer, the first charge generation layer defining a PN-junction therein;
a second hole transport layer over the first charge generation layer;
a second light emitting layer over the second hole transport layer;
a third light emitting layer over the second light emitting layer;
a second electron transport layer over the third light emitting layer; and
a cathode over the second electron transport layer,
wherein the second light emitting layer includes a hole-type host and a first electron-type host, and the third light emitting layer includes the first electron-type host and a second electron-type host,
wherein an electron mobility of the first electron-type host is lower than an electron mobility of the second electron-type host,
wherein the electron mobility of the first electron-type host is equal to or lower than $1 \times 10^{-5}$ cm$^2$/Vs, and the electron mobility of the second electron-type host is within a range from $1 \times 10^{-5}$ cm$^2$/Vs to $1 \times 10^{-4}$ cm$^2$/Vs,
wherein a LUMO (lowest unoccupied molecular orbital) level of the second electron-type host is lower than a LUMO level of the first electron-type host,
wherein a difference in the LUMO levels between the first electron-type host and the second electron-type host is equal to or less than 0.5 eV,
wherein the LUMO level of the first electron-type host is within a range of −2.3 eV to −2.5 eV and the LUMO level of the second electron-type host is within a range of −2.6 eV to −2.8 eV, and
wherein a HOMO (highest occupied molecular orbital) level of each of the first electron-type host and the second electron-type host is within a range of −5.4 eV to −5.8 eV.

2. The organic light emitting display device of claim 1, wherein an occupied volume ratio of the first electron-type host adjacent to the anode is equal to or larger than an occupied volume ratio of the second electron-type host adjacent to the cathode.

3. The organic light emitting display device of claim 1, wherein the first light emitting layer includes a blue light emitting layer.

4. The organic light emitting display device of claim 1, wherein the second light emitting layer includes a yellow-green light emitting layer.

5. The organic light emitting display device of claim 1, wherein the third light emitting layer includes a yellow-green light emitting layer.

6. The organic light emitting display device of claim 1, wherein the second light emitting layer and the third light emitting layer include a same yellow dopant.

7. The organic light emitting display device of claim 1, further comprising:
- a second charge generation layer over the second electron transport layer;
- a third hole transport layer over the second charge generation layer;
- a fourth light emitting layer over third hole transport layer; and
- a third electron transport layer over the fourth light emitting layer.

8. The organic light emitting display device of claim 7, wherein the fourth light emitting layer includes a blue emitting layer.

9. The organic light emitting display device of claim 1, wherein the first light emitting layer is closer to the anode than the second and third light emitting layers, and the second and third emitting layer are closer to the cathode than the first light emitting layer.

10. The organic light emitting display device of claim 1, wherein the first electron-type host is disposed in a first portion of the third light emitting layer, and the second electron-type host is disposed in a second portion of the third light emitting layer, and wherein the first portion is closer to the cathode than the second portion, and the second portion is closer to the anode than the first portion.

11. The organic light emitting display device of claim 1, wherein a ratio of the hole type host and the first electron type host in the second light emitting layer is 1:1, and a ratio of the first electron type host and the second electron type host in the third light emitting layer is one of 3:7, 5:5 and 7:3.

* * * * *